United States Patent [19]
Riley et al.

[11] 3,846,822
[45] Nov. 5, 1974

[54] METHODS FOR MAKING FIELD EFFECT TRANSISTORS

[75] Inventors: Terence James Riley, Warren; Peter William Shackle, Sommerville, both of N.J.

[73] Assignee: Bell Telephone Laboratories, Incorporated, Murray Hill, N.J.

[22] Filed: Oct. 5, 1973

[21] Appl. No.: 403,918

[52] U.S. Cl. .................... 357/23, 357/68, 357/91, 29/571, 29/579
[51] Int. Cl. .................... H01l 11/00
[58] Field of Search .......... 29/571, 576 B, 579, 578; 317/235 B

[56] References Cited

UNITED STATES PATENTS

| | | | |
|---|---|---|---|
| 3,258,898 | 7/1966 | Garibotti | 29/576 B |
| 3,387,360 | 6/1968 | Nakamura | 29/579 |
| 3,523,042 | 8/1970 | Bower | 29/576 B |
| 3,761,785 | 9/1973 | Pruniaux | 29/579 |

*Primary Examiner*—Roy Lake
*Assistant Examiner*—W. C. Tupman
*Attorney, Agent, or Firm*—R. B. Anderson

[57] ABSTRACT

A self-aligned high-frequency IGFET having source, channel, drift and drain regions, and a gate electrode electrically isolated from the drift region, is made by using an oxide mesa to define the boundaries of the gate electrode, drift region and drain region. The gate electrode is formed by using the mesa as a shadow mask during an ion milling operation.

12 Claims, 6 Drawing Figures

METHODS FOR MAKING FIELD EFFECT TRANSISTORS

BACKGROUND OF THE INVENTION

This invention relates to field effect transistors, and more particularly, to high-frequency insulated gate field effect transistors (IGFETS) and methods for making such transistors.

IGFET devices normally comprise, on the upper surface of a wafer, source and drain regions interconnected by a channel region through which current is controlled by an insulated gate electrode. The paper "Double-Diffused MOS Transistor Achieves Microwave Gain," by T. P. Cauge et al., *Electronics*, Feb. 15, 1971, pages 99–104, describes an IGFET in which a drift region is included between the channel and drain regions. Cauge et al. describe a process including "double diffusion" for defining both the drift region and an extremely short channel, the short channel being desirable for microwave frequency operation. The drift region permits higher power gain by permitting higher drain voltages and by giving better defined current-voltage characteristics.

While the Cauge et al. paper suggests that the gate electrode should overlap the drift region, the copending application of B. R. Pruniaux, T. J. Riley, R. M. Ryder and H. A. Waggener, Ser. No. 314,785, filed Dec. 13, 1972, now U.S. Pat. No. 3,823,352, assigned to Bell Telephone Laboratories, Incorporated, teaches that it is definitely advantageous to restrict the extent of the gate electrode such that it overlies only the channel. Pruniaux et al. teach that the gate electrode may slightly overlie the source, but that it is definitely preferable that it be electrically isolated from the drift and drain regions. For the microwave purposes being discussed, channel lengths of less than a micron are contemplated, and it is impossible, by conventional photolithographic techniques, to make a correspondingly small gate electrode and to align it precisely over the short channel region.

The B. R. Pruniaux et al. application solves these alignment problems by using successive layers to constitute the source, channel, drift and drain regions, and then using anisotropic etching and undercutting techniques to form a short channel region. This self-aligned mask is then used to control the formation of a gate electrode that is precisely registered with the channel region. While the B. R. Pruniaux et al. technique is extremely promising, the vertical arrangement of the various electrical regions gives certain inherent disadvantages. With respect to conventional horizontal IGFET structures, the "vertical channel" structure is less consistent with known integrated circuit techniques and therefore requires a considerable degree of skill in its fabrication. Contacting the gate electrode may result in undesirable capacitive coupling between the overlapping layers unless certain corrective steps are taken, which further complicates fabrication.

SUMMARY OF THE INVENTION

In accordance with the present invention, it is possible to make a "horizontal channel" field effect transistor comprising source, channel, drift and drain regions in which the gate electrode overlies and controls current flow in an extremely short channel region, but does not necessarily overlie any portion of the drift region.

In accordance with one embodiment of the invention, an oxide mesa is formed over that portion of a semiconductor wafer surface which is eventually to constitute an IGFET drift region. A thin oxide layer is then formed over the remainder of the wafer surface. The gate electrode is formed by covering the entire oxide surface with a thin metal layer, and then ion milling most of the metal layer by projecting ions at the wafer at an angle with respect to the mesa. In doing this, all of the metal is removed except that on one side of the mesa which is shadow masked by the mesa.

Next, the channel region is diffused beneath the gate electrode by ion implantation and subsequent lateral diffusion. Because the extent of lateral diffusion is precisely controllable, one can, by this technique, virtually guarantee that the channel region and the gate electrode will be coextensive. The source region is formed by implanting and diffusing a second impurity into the same wafer portion as the channel diffusion, but to a shallower depth; this technique is a form of the "double diffusion" referred to by Cauge et al. Because the source boundary is defined by one edge of the gate electrode, it too is precisely aligned with the gate electrode. The drain region is preferably formed concurrently with the formation of the source region using the side of the oxide mesa opposite the gate electrode for defining the critical drain boundary. With this procedure, the lengths of the channel and drift regions are made with precise accuracy and the gate electrode is accurately aligned over the channel.

These and other objects, features and advantages of the invention will be better understood from consideration of the following detailed description taken in conjunction with the accompanying drawing.

DRAWING DESCRIPTION

FIG. 1 is a schematic cross-sectional view of an IGFET made in accordance with an illustrative embodiment of the invention; and FIGS. 2 through 6 are schematic cross-sectional views of the IGFET of FIG. 1 at various stages in its fabrication.

DETAILED DESCRIPTION

Figure 1:
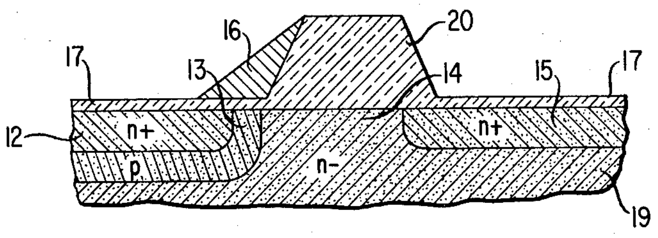

Referring now to FIG. 1 there is shown a cross-sectional view of a field effect transistor, made in accordance with an illustrative embodiment of the invention, comprising a source region 12, a channel region 13, a drift region 14 and a drain region 15. Appropriate electrodes, not shown, make contact with the source and drain regions. A gate electrode 16 overlies the channel region 13 and is insulated from it by a thin oxide layer 17. The various regions are formed in a semiconductor wafer 19 in a manner that will be described more fully later. The gate electrode 16 is supported on one side by an oxide mesa 20, the function of which will likewise be described later. The conductivity types of the various regions are indicated on the drawing for illustrative purposes only.

During operation, a sufficient positive voltage is applied to drain region 15 to deplete of all background charge carriers the operative portion of drift region 14. A sufficient positive voltage is applied to gate electrode 16 to invert the conductivity of channel region 13 to n-type conductivity, thereby to permit electron conduction between the source and drain regions via the channel and drift regions. Modulation of the gate voltage controls this conduction to make possible, as is known, such useful functions as amplification and switching.

As mentioned previously, the drift region 14 enhances device operation because, among other reasons, it permits higher power gain, both by giving a flatter current-voltage curve in the saturation portion of the curve, and by permitting a higher reverse-bias voltage on the drain. It also reduces interelectrode capacitances in a manner consistent with a short channel length. As was described in the aforementioned Pruniaux application, the drift region should be of a relatively low carrier concentration, with a conductivity type opposite that of the non-inverted channel region in order to provide compensation for the space-charge forces of the current carriers. That is, in its depleted condition, ionized impurities in drift region 14 provide electronic field compensation for the negative charge of electrons injected from the channel, thereby reducing limitations on the channel current and device power by electron space-charge forces.

Because of the particular device construction, the channel 13 and the gate electrode 16 may be extremely short, as is required for high-frequency or microwave operation, but nevertheless, the gate electrode is substantially electrically isolated from the drift region 14. The oxide mesa 20 minimizes spurious gate-to-drain capacitances, but more importantly, as will be described later, it provides for self-alignment of the gate electrode 16 over the channel region 13. Specifically, the channel length may be on the order of only 0.2 micrometers long, but nevertheless, the gate electrode is precisely defined over the channel region with substantially no overlap over the drift region. Fabrication of devices having such small dimensions, with registration to within such exacting tolerances, would not be possible by conventional fabrication techniques; the method by which the device is accurately and precisely formed in accordance with an illustrative embodiment of the invention will be discussed with reference to FIGS. 2 through 6.

Figure 2:
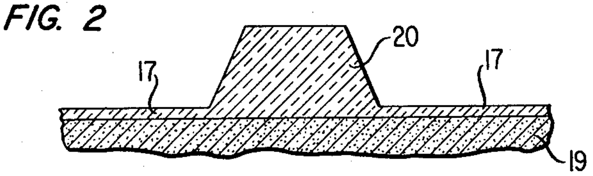

Referring to FIG. 2, a thick oxide layer is first formed over wafer 19, the layer having a thickness equal to the height of the intended mesa 20. The mesa is then formed by conventional masking and etching. For example, the wafer is typically of silicon, the thick layer is of silicon dioxide, and the mesa is formed by exposing an unmasked portion of the thick layer to an etchant that selectively dissolves silicon dioxide. Next, the thin oxide layer 17 is formed, as by conventional oxide growth.

Figure 3:
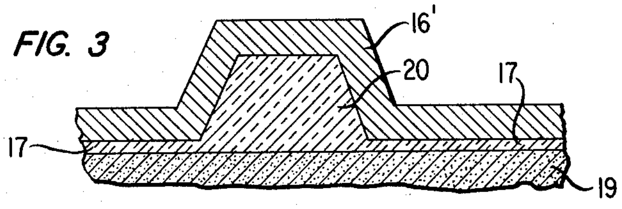
Figure 4:
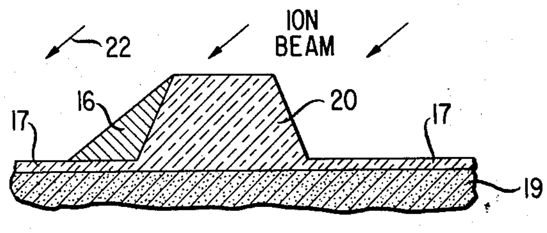

Referring to FIG. 3, the entire oxide surface is next coated with a thin metal layer 16'. The layer may, for example, be tungsten with a thickness of 0.5 micrometers. Referring to FIG. 4, a major portion of layer 16' is removed by ion milling at an angle. That is, an ion beam 22 of appropriate intensity is directed at an angle of, for example, 50°, to vaporize all of that portion of the layer 16' not masked from the ion beam by mesa 20. Because of the angle of the ion beam, the mesa constitutes a shadow mask with respect to a shielded portion of the metal layer on one side of the mesa which thereafter constitutes the gate electrode 16.

Figure 5:
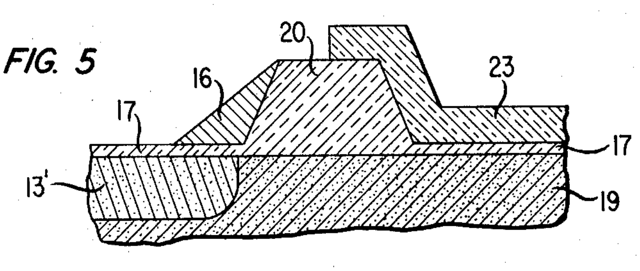

Referring to FIG. 5, that portion of the wafer overlying the intended drain region is next masked with a photoresist coating 23. Impurities are then ion implanted into the unmasked portion of the wafer and diffused so as to form a p-type channel layer 13'. The impurities are chosen in a known manner so as to give a proper conductivity to the channel region 13 of the finished device; that portion of diffused region 13' underlying gate electrode 16 will of course eventually constitute the channel region 13 of FIG. 1.

An important feature of this step is that the mask 23 may be formed by conventional masking techniques without particularly great precision. This is because the edge of the mask 23 may lie anywhere on the mesa 20 or the gate electrode 16, and thus, the tolerances for registration accuracy of this masking step are not stringent. Another important factor is that, because the extent of lateral diffusion is highly predictable, channel layer 13' can easily be made to be coextensive with gate electrode 16 as required for accurate registration of the gate electrode with the channel region.

Figure 6:
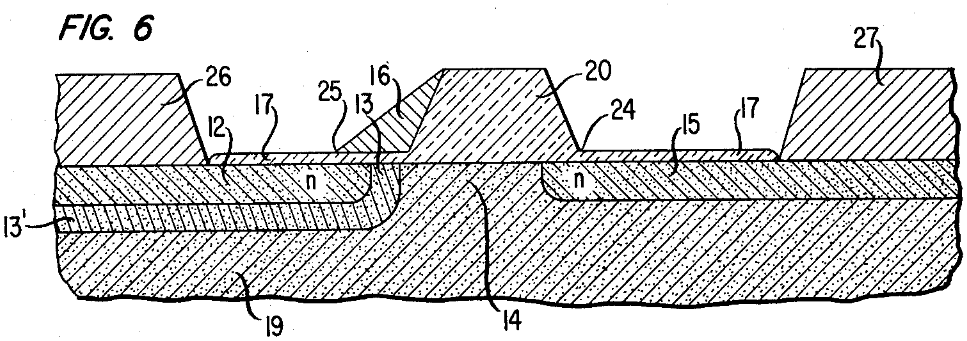

Referring to FIG. 6, the photoresist layer 23 is next removed by conventional techniques, and the source region 12 and drain region 15 are formed by ion implantation and diffusion using mesa 20 and gate electrode 16 as a mask. That is, one boundary of the drain region is defined by one extreme edge 24 on the mesa 20, and a critical boundary of the source region 12 is defined by an edge 25 of the gate electrode. After ion implantation of the n-type impurities, the impurities are driven into the wafer by diffusion, but the diffusion is shallower than that of the diffusion of channel layer 13'. The portion of the wafer between layer 13' and drain region 15 constitutes the drift region 14, while that portion of layer 13' between the source region 12 and the drift region 14 constitutes the channel region 13. Thereafter, a source electrode 26 is formed on the source region, and a drain electrode 27 is formed on the drain region.

The source and drain electrodes may be aluminum or PdSi-Ti-Pd-Au and may be formed in a manner known in the art. The conductivities of the silicon source, channel, drift and drain regions may respectively be $10^{21}$, $10^{17}$, $10^{15}$ and $10^{21}$ carriers per cubic centimeter. Another advantage of our device with respect to the embodiments shown in the B. R. Pruniaux et al. application is that carrier concentration of one layer is not limited by the need for forming an epitaxial layer over it as is true in B. R. Pruniaux et al. The channel and drift region lengths may typically be 0.2 and 0.8 micrometers, respectively. The heights of oxide layer 17 and mesa 20 may respectively be 0.1 and 0.5 micrometers, and the diffusion depths of the source and drain layers may each be 0.2 micrometers. It is understood that "length" refers to the horizontal dimension shown; actually all of the structures may be constructed as stripes with the dimensions extending "into the paper" being much longer than the horizontal dimensions shown.

From the foregoing it will be appreciated that a "horizontal channel" IGFET has been described which can be made with smaller channel dimensions and greater alignment accuracy than would be possible by conventional integrated circuit techniques. The accuracy and inherent self-alignment of our device derives from the inherent accuracy of shadow masking as a technique for defining the location of the gate electrode 16, and also the accuracy with which lateral diffusion can be used to define the boundary of the channel region.

Making use of these two characteristics inherently results in self-alignment of the gate electrode over the channel region, even though the channel region length is in the submicron range, while avoiding deleterious overlap of the gate electrode over the drift region. Further, the length of the drift region, being in this case 0.8 micrometers, can also be conveniently optimized. It is clear that contacts to the structure can easily be made by known integrated circuit techniques.

Ion milling is a known technique typically using a neutralized collimated beam of argon ions for the milling operation. In our experiments, a machine known as the VEECO ion milling machine, commercially available from the VEECO Company, was used for vaporizing the tungsten coating as previously described. The steps of forming the desired source, channel and drain regions by ion implantation through a thin oxide film, appropriate heating to give predictable vertical and lateral diffusion, and subsequent annealing, have not been described since these processes are well understood and widely used in the art. In accordance with the invention, materials other than silicon could be used if so desired, and the particular impurities used for formation of the various conductivity regions could be varied and could be of any of a number of known types depending on the particular device parameters desired. While ion milling is the preferred technique for taking advantage of the mesa shadow mask as described, other forms of radiant energy projected at an angle could also be used for defining the gate electrode in various ways which would be obvious to those skilled in the art. Highly controllable and predicable mesa sidewall slopes may be made by techniques described in the paper "Tapered Windows in $SiO_2$ by Ion Implantation," by R. A. Moline et al., *Institute of Electrical and Electronics Engineers Transactions on Electron Devices*, September, 1973.

Numerous other modifications and embodiments may be made by those skilled in the art without departing from the spirit and scope of the invention.

What is claimed is:

1. In a method for making a field effect transistor comprising the steps of forming source, channel, drift and drain regions, and a gate electrode overlying the channel region, the improvement comprising the steps of:

forming an oxide mesa over the drift region portion of a semiconductor wafer;

defining the gate electrode on one side of the mesa by shadow masking, said defining step comprising the step of irradiating the mesa at an angle;

and using one side of the mesa to define one boundary of the drain region and one side of the gate electrode to define one boundary of the source region.

2. The method of claim 1 wherein:

the channel region forming step comprises the steps of:

first, forming a mask over the drain region portion of the wafer, second, depositing first impurities on the semiconductor wafer not masked by the mask, the mesa or the gate electrode, and diffusing the deposited impurities into the wafer, whereby the impurities laterally diffuse beneath one side of the gate electrode.

3. The method of claim 2 wherein:

the source forming step comprises the steps of depositing second impurities on the wafer surface impregnated by the first impurities, and diffusing the second impurities to a shallower depth than the first impurity diffusion, thereby to leave intact a short channel region defined beneath the gate electrode.

4. The method of claim 3 wherein:

the gate electrode defining step comprises the steps of coating a surface of the wafer and mesa with a metal layer, and ion milling all but a gate electrode portion of the metal layer by irradiating the mesa at an angle with ions.

5. The method of claim 4 further comprising the steps of:

forming a thin oxide layer over the wafer portion not covered by the mesa;

and wherein the depositing steps each comprises the step of ion implanting impurities in the wafer through the thin oxide layer.

6. The method of claim 5 wherein:

the gate electrode is formed over the thin oxide layer overlying the channel region, whereby the transistor constitutes an IGFET.

7. The improvement of claim 6 wherein:

the wafer is of silicon, and the oxide mesa and the thin oxide layer are of silicon dioxide.

8. The improvement of claim 7 wherein:

the channel length at the wafer surface is of the order of 0.2 micrometers, the gate electrode length is of the order of 0.4 micrometers, and there is substantially no overlap of the gate electrode over the drift region.

9. The improvement of claim 8 wherein:

the silicon dioxide mesa is formed by forming a silicon dioxide layer approximately 0.5 micrometers thick, and etching a major portion of it to define the mesa, the mesa defining a drift region length of approximately 0.8 micrometers.

10. A method for making a field effect transistor comprising the steps of:

forming a first relatively thick oxide layer over a semiconductor wafer surface;

etching all but a portion of the first oxide layer to define an oxide mesa on the wafer surface;

forming a second, relatively thin, oxide layer over the wafer surface;

forming a metal layer over the second oxide layer and the mesa;

removing all the metal layer except a portion on one side of the mesa, thereby to define a gate electrode;

said removing step comprising the step of irradiating the mesa at an angle such that the mesa shadow masks the gate electrode portion of the metal layer;

diffusing a first impurity into a first wafer portion contiguous with the gate electrode;

diffusing a second impurity into the first wafer portion and into a second wafer portion contiguously with the mesa but opposite the gate electrode, the second impurity in the first wafer portion defining a transistor source region, and the second impurity in the second wafer portion defining a drain region;

and forming metal contacts on the source and drain regions.

11. The method of claim 10 wherein:

the removing step comprises the step of ion milling that portion of the metal layer that is not shadow masked by the mesa.

12. A field effect transistor made by the method set forth in claim 10.

* * * * *